United States Patent
Chou et al.

(10) Patent No.: US 8,865,585 B2
(45) Date of Patent: Oct. 21, 2014

(54) METHOD OF FORMING POST PASSIVATION INTERCONNECTS

(75) Inventors: Meng-Wei Chou, Zhubei (TW); Hung-Jui Kuo, Hsin-Chu (TW); Ming-Che Ho, Tainan (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/546,300

(22) Filed: Jul. 11, 2012

(65) Prior Publication Data

US 2014/0015122 A1    Jan. 16, 2014

(51) Int. Cl.
*H01L 21/44*  (2006.01)

(52) U.S. Cl.
USPC .............................. 438/612; 438/598; 257/774

(58) Field of Classification Search
None
See application file for complete search history.

(56) References Cited

U.S. PATENT DOCUMENTS

| | | | |
|---|---|---|---|
| 7,994,045 B1* | 8/2011 | Huemoeller et al. | 438/612 |
| 2009/0115058 A1* | 5/2009 | Yu et al. | 257/738 |
| 2011/0141205 A1* | 6/2011 | Gerner et al. | 347/71 |
| 2012/0104625 A1* | 5/2012 | Park et al. | 257/774 |

* cited by examiner

*Primary Examiner* — Whitney T Moore
*Assistant Examiner* — Joseph Galvin, III
(74) *Attorney, Agent, or Firm* — Slater & Matsil, L.L.P.

(57) ABSTRACT

A method of forming post passivation interconnects comprises forming a passivation layer over a substrate, wherein a metal pad is embedded in the passivation layer, depositing a first dielectric layer on the passivation layer, applying a first patterning process to the first dielectric layer to form a first opening, forming a first seed layer over the first opening, filling the first opening with a conductive material, depositing a second dielectric layer on the first dielectric layer, applying a second patterning process to the second dielectric layer to form a second opening, forming an under bump metallization structure over the second opening and mounting an interconnect bump over the under bump metallization structure.

20 Claims, 12 Drawing Sheets

METHOD OF FORMING POST PASSIVATION INTERCONNECTS

BACKGROUND

The semiconductor industry has experienced rapid growth due to continuous improvements in the integration density of a variety of electronic components (e.g., transistors, diodes, resistors, capacitors, etc.). For the most part, this improvement in integration, density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, wafer-level chip scale package structures have emerged as an effective alternative to further reduce the physical size of semiconductor devices. In a wafer-level chip scale package structure, active devices such as transistors and the like are formed at the top surface of a substrate of the wafer-level chip scale package structure. A variety of metallization layers comprising interconnect structures are formed over the substrate. A metal pad is formed over the top metallization layer and electrically coupled to the interconnect structures. A passivation layer and a first polymer layer may be formed over the metal pad. The metal pad is exposed through the openings in the passivation layer and the first polymer layer.

A first seed layer is then formed on the first polymer layer. Post-passivation interconnect (PPI) metal lines and pads may be formed over the first seed layer by using suitable fabrication techniques such as forming and patterning a first photo resist layer on the first seed layer, plating the PPI metal lines and pads in the openings in the first photo resist layer, and then removing the first photo resist layer. Furthermore, the portions of the first seed layer that were previously covered by the first photo resist layer are removed by using suitable etching processes.

A second polymer layer may be formed over the PPI lines and pads. A second opening for an under bump metallization (UBM) structure is formed by using suitable fabrication techniques such as patterning. A second seed layer is formed over the second polymer layer. The UBM structure is formed extending into the second opening in the second polymer layer, wherein the UBM structure is electrically connected to the PPI metal lines and pads. The fabrication steps of the UBM structure include forming a second photo resist layer over the second seed layer, patterning the second photo resist layer, forming the UBM structure on the second seed layer, removing the second photo resist layer, and removing the portions of the second seed layer that were previously covered by the second photo resist layer.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, fabrication steps of a semiconductor device having a chip scale packaging feature. The embodiments of the disclosure may also be applied, however, to a variety of semiconductor devices. Hereinafter, various embodiments will be explained in detail with reference to the accompanying drawings.

Figure 1:
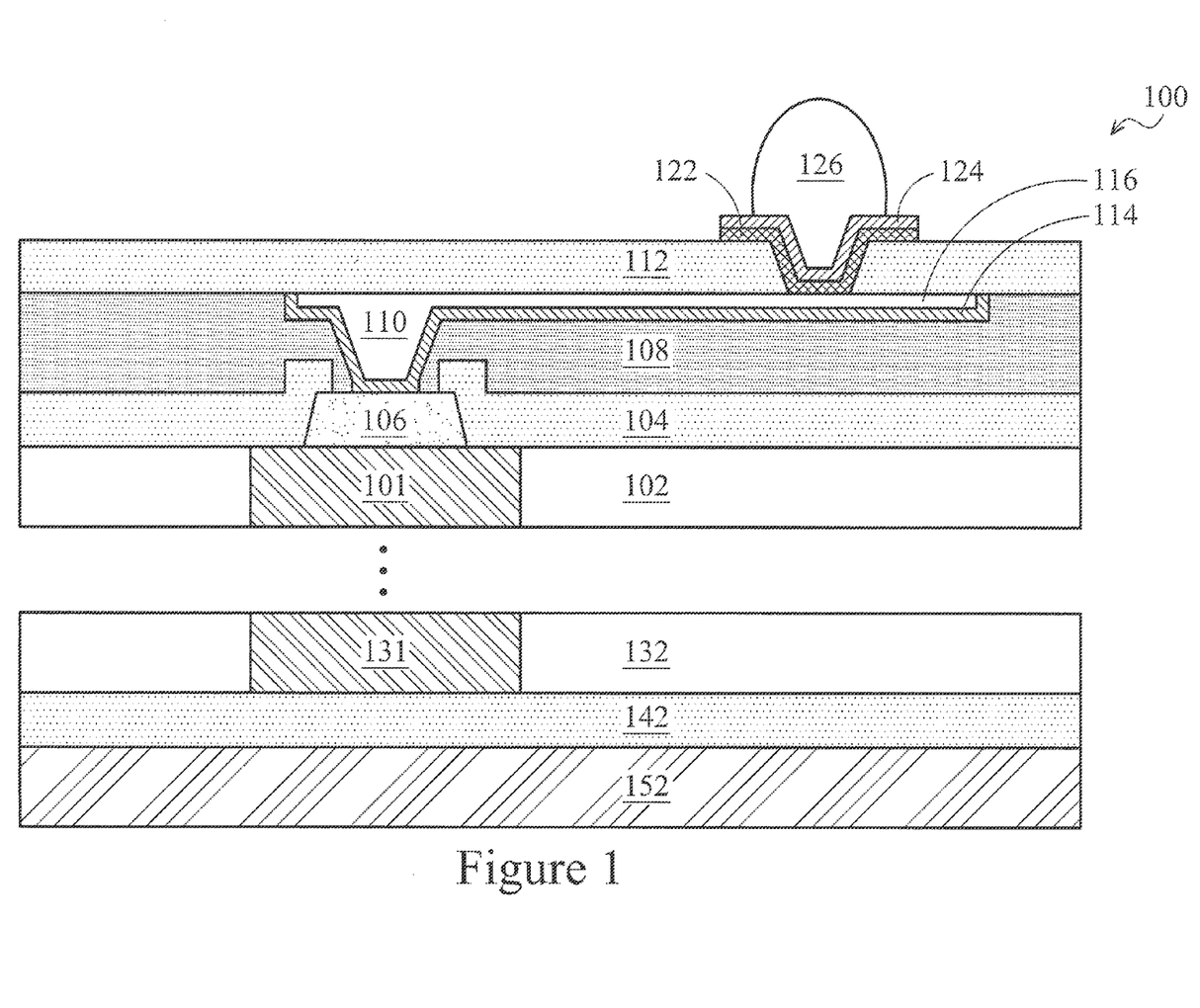
FIG. 1 illustrates a cross sectional view of a semiconductor device having a chip scale packaging feature in accordance with an embodiment.

FIG. 1 illustrates a cross sectional view of a semiconductor device having a chip scale packaging feature in accordance with an embodiment. As shown in FIG. 1, the semiconductor device 100 comprises a substrate 152. The substrate 152 may be formed of silicon, silicon germanium, silicon carbide or the like. Alternatively, the substrate 152 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. In addition, other substrates that may be used include multi-layered substrates, gradient substrates, hybrid orientation substrates and the like.

The substrate 152 may further comprise a variety of electrical circuits (not shown). The electrical circuits formed on the substrate 152 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 142 is formed on top of the substrate 152. The interlayer dielectric layer 142 may be formed, for example, of a low-K dielectric material, such as silicon oxide. The interlayer dielectric layer 142 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 142 may further comprise a plurality of dielectric layers.

A bottom metallization layer 132 and a top metallization layer 102 are formed over the interlayer dielectric layer 142. As shown in FIG. 1, the bottom metallization layer 132 comprises a first metal line 131. Likewise, the top metallization layer 102 comprises a second metal line 101. Metal lines 131 and 101 are formed of metal materials such as copper or copper alloys and the like. The metallization layers 132 and 102 may be formed through any suitable techniques (e.g., deposition, damascene and the like). Generally, the one or more inter-metal dielectric layers and the associated metallization layers are used to interconnect the electrical circuits in the substrate 152 to each other to form functional circuitry and to further provide an external electrical connection.

It should be noted while FIG. 1 shows the bottom metallization layer 132 and the top metallization layer 102, one skilled in the art will recognize that one or more inter-metal dielectric layers (not shown) and the associated metallization layers (not shown) are formed between the bottom metallization layer 132 and the top metallization layer 102. In particular, the layers between the bottom metallization layer 132 and the top metallization layer 102 may be formed by alternating layers of dielectric (e.g., extremely low-k dielectric material) and conductive materials (e.g., copper).

A passivation layer 104 is formed on top of the top metallization layer 102. In accordance with an embodiment, the passivation layer 104 is formed of non-organic materials such as un-doped silicate glass, silicon nitride, silicon oxide and the like. Alternatively, the passivation layer 104 may be formed of low-k dielectric such as carbon doped oxide and the like. In addition, extremely low-k (ELK) dielectrics such as porous carbon doped silicon dioxide can be employed to form the passivation layer 104.

The passivation layer 104 may be formed through any suitable techniques such as CVD. As shown in FIG. 1, there may be an opening formed in the passivation layer 104. The opening is used to accommodate the top metal pad 106.

As shown in FIG. 1, the top metal pad 106 is embedded in the passivation layer 104. In particular, the top metal pad 106 provides a conductive channel between the metal line 101 and a post passivation interconnect structure 110 of the semiconductor device 100. The top metal pad 106 may be made of metallic materials such as copper, copper alloys, aluminum, silver, gold and any combinations nations thereof, and/or multi-layers thereof. The top metal pad 106 may be formed by suitable techniques such as CVD. Alternatively, the top metal pad 106 may be formed by sputtering, electroplating and the like.

A first polymer layer 108 is formed on top of the passivation layer 104. The first polymer layer 108 is made of polymer materials such as epoxy, polyimide and the like. Alternatively, the first polymer layer 108 may be formed of suitable polymer dielectric materials such as polybenzoxazole (PBO). The first polymer layer 108 may be made by any suitable method known in the art such as spin coating.

A post passivation interconnect structure 110 is formed in the first polymer layer 108. As shown in FIG. 1, the post passivation interconnect structure 110 may comprise a seed layer 114 and a metal line 116 formed over the seed layer 114. The post passivation interconnect structure 110 connects the metal pad 106 with an input/output terminal of the semiconductor device 100. More particularly, the post passivation interconnect structure 110 provides a conductive path between the metal lines (e.g., metal line 101) and the input/output terminal of the semiconductor device 100 (e.g., interconnect bump 126). The operation principles of post passivation interconnect structures are well known in the art, and hence are not discussed in detail herein A second polymer layer 112 is formed on top of the first polymer layer 108. The second polymer layer 112 is made of polymer materials such as epoxy, polyimide and the like. Alternatively, the second polymer layer 112 may be formed of suitable polymer dielectric materials such as PBO. The second polymer layer 112 may be made by any suitable method known in the art such as spin coating.

The second polymer layer 112 is patterned to form an opening. Furthermore, an under bump metal (UBM) structure is formed on top of the opening. As shown in FIG. 1, the UBM structure may comprise a seed layer 122 and a conductive material layer 124. The UBM structure is employed to connect the post passivation interconnect structure 110 with an input and output terminal (e.g., bump 126). The UBM structure may be formed by any suitable techniques such as electroplating, electro-less plating and the like. Other processes of formation such as sputtering, evaporation, PECVD and the like may alternatively be used depending upon the desired materials.

The bump 126 is mounted on the UBM structure. In accordance with an embodiment, the bump 126 may be a copper bump. The copper bump may be of a height of approximately 45 um. In accordance with an embodiment, a variety of semiconductor packaging technologies such as sputtering, electroplating and photolithography can be employed to form the copper bump.

In accordance with another embodiment, the bump 126 may be a solder ball. The solder ball 126 may be made of any of suitable materials. In accordance with an embodiment, the solder ball 126 my be formed of SAC405. SAC405 comprises 95.5% Sn, 4.0% Ag and 0.5% Cu.

Figure 2:
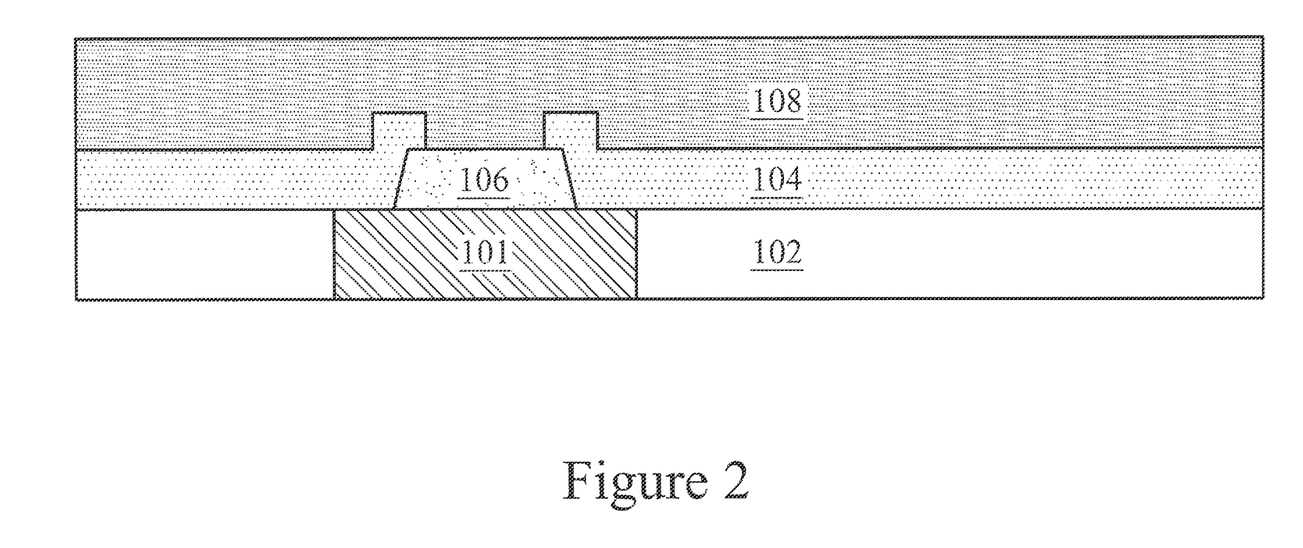
FIG. 2 illustrates a cross sectional view of a semiconductor device after a first polymer layer is formed over the semiconductor device in accordance with an embodiment.

FIGS. 2-12 are cross sectional views of intermediate stages in the making of a post passivation interconnect structure of the semiconductor device 100 shown in FIG. 1 in accordance with an embodiment. FIG. 2 illustrates a cross sectional view of a semiconductor device after a first polymer layer is formed over the semiconductor device in accordance with an embodiment. For simplicity, the layers and structures below the top metallization layer 102 are not included in the fabrication steps illustrated in FIGS. 2-12.

As shown in FIG. 2, a passivation layer 104 is formed over the top metallization layer 102. A metal pad 106 is embedded in the passivation layer 104. In addition, the metal pad 106 is exposed through an opening of the passivation layer 104. A first polymer layer 108 is deposited on top of the passivation layer 104. The first polymer layer 108 may be formed of suitable polymer dielectric materials such as PBO. The first polymer layer 108 may be of a thickness in a range from about 4 um to about 10 um.

Figure 3:
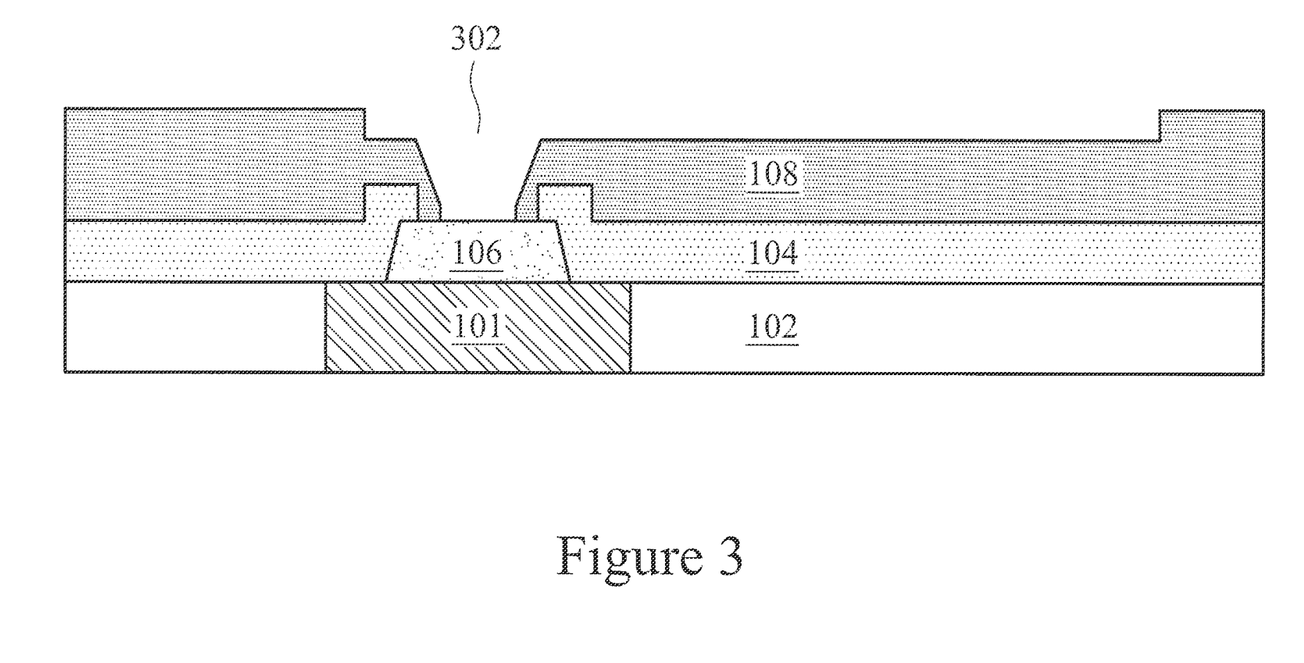
FIG. 3 illustrates a cross sectional view of the semiconductor device shown in FIG. 2 after a first patterning process is applied to the surface of the first polymer layer in accordance with an embodiment.

FIG. 3 illustrates a cross sectional view of the semiconductor device shown in FIG. 2 after a first patterning process is applied to the surface of the first polymer layer accordance with an embodiment. The first patterning process may be implemented by using a laser ablation process. According to the shape and location of the post passivation interconnect structure 110 (not shown but illustrated in FIG. 1), a laser beam (not shown) is applied to the top surface of the first polymer layer 108. As a result, a portion of the first polymer layer 108 is removed to form an opening 302. In accordance with an embodiment, the wavelength of the laser beam is about 308 nm. The energy dosage of the laser beam is in range from about 500 mJ/cm$^2$ to about 600 mJ/cm$^2$.

Figure 4:
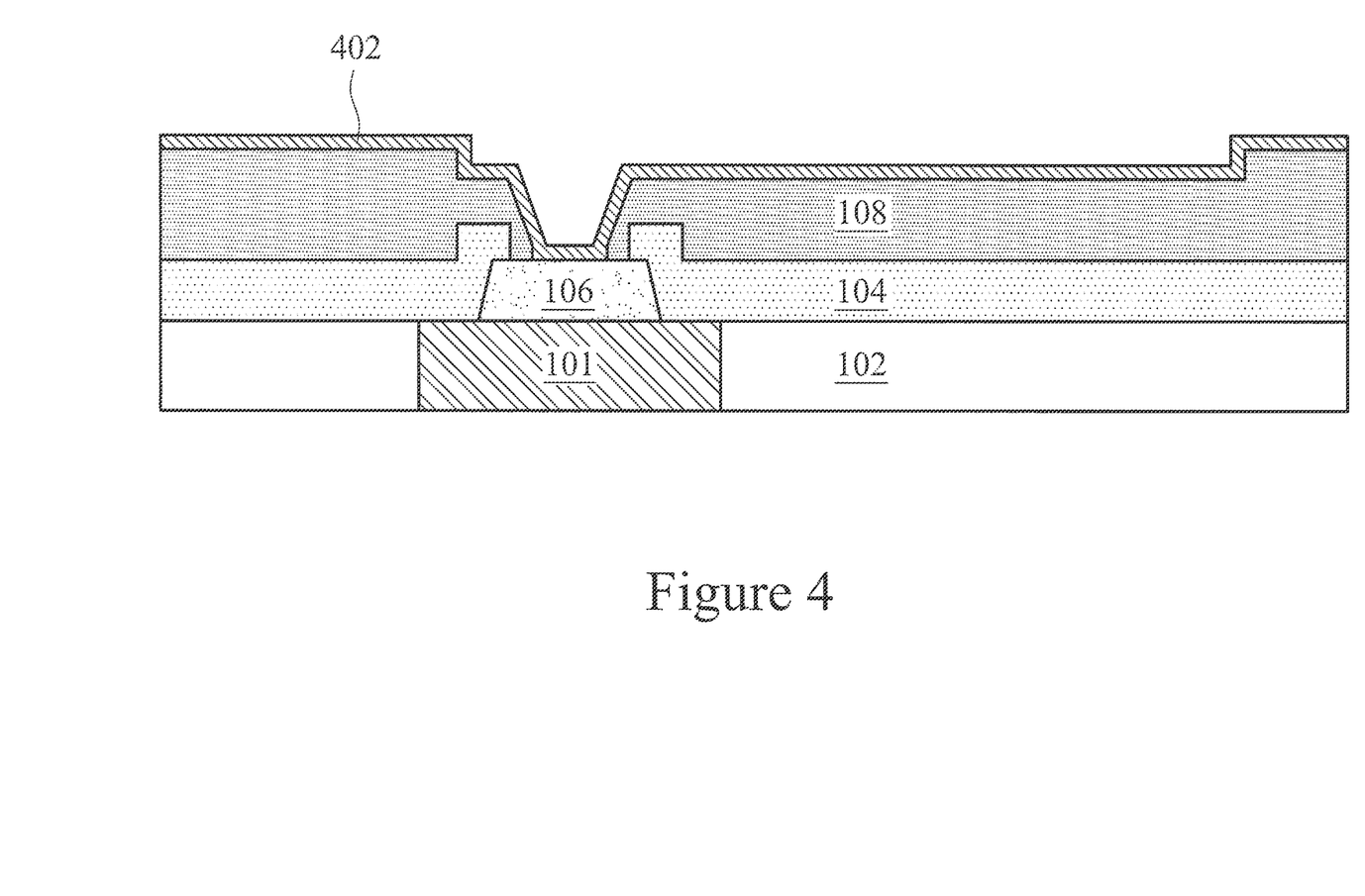
FIG. 4 illustrates a cross sectional view of the semiconductor device shown in FIG. 3 after a seed layer is formed on top of the first polymer layer in accordance with an embodiment.

FIG. 4 illustrates a cross sectional view of the semiconductor device shown in FIG. 3 after a seed layer is formed on top of the first polymer layer in accordance with an embodiment. In order to provide a nucleation site for the subsequent bulk metal deposition, a thin seed layer 402 is deposited on the first polymer layer 108. The thin seed layer 402 may comprise conductive materials such as copper. The thin seed layer 402 may be implemented by using suitable fabrication techniques such as sputtering, CVD or the like.

Figure 5:
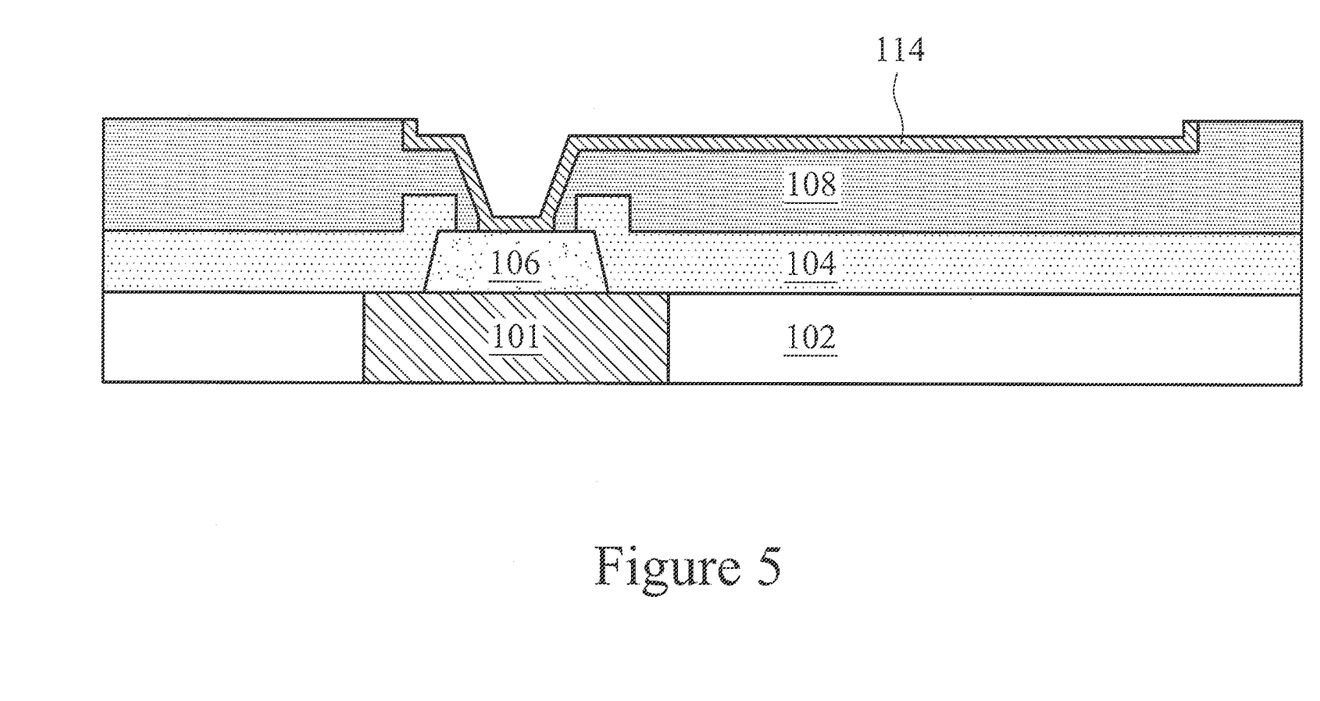
FIG. 5 illustrates a cross sectional view of the semiconductor device shown in FIG. 4 after a second patterning process is applied to the surface of the seed layer in accordance with an embodiment.

FIG. 5 illustrates a cross sectional view of the semiconductor device shown in FIG. 4 after a second patterning process is applied to the surface of the seed layer in accordance with an embodiment. The second patterning process may be implemented by using another laser ablation process. A laser beam (not shown) is applied to the top surface of the non-trench portions of the seed layer 402 (shown in FIG. 4). As a result, the portions of the seed layer 402 on the non-trench portions of the first polymer layer 108 are removed to form the seed layer 114. In accordance with an embodiment, the wavelength of the laser beam is about 308 nm. The energy dosage of the laser beam is in range from about 1000 mJ/cm$^2$ to about 1200 mJ/cm$^2$.

Figure 6:
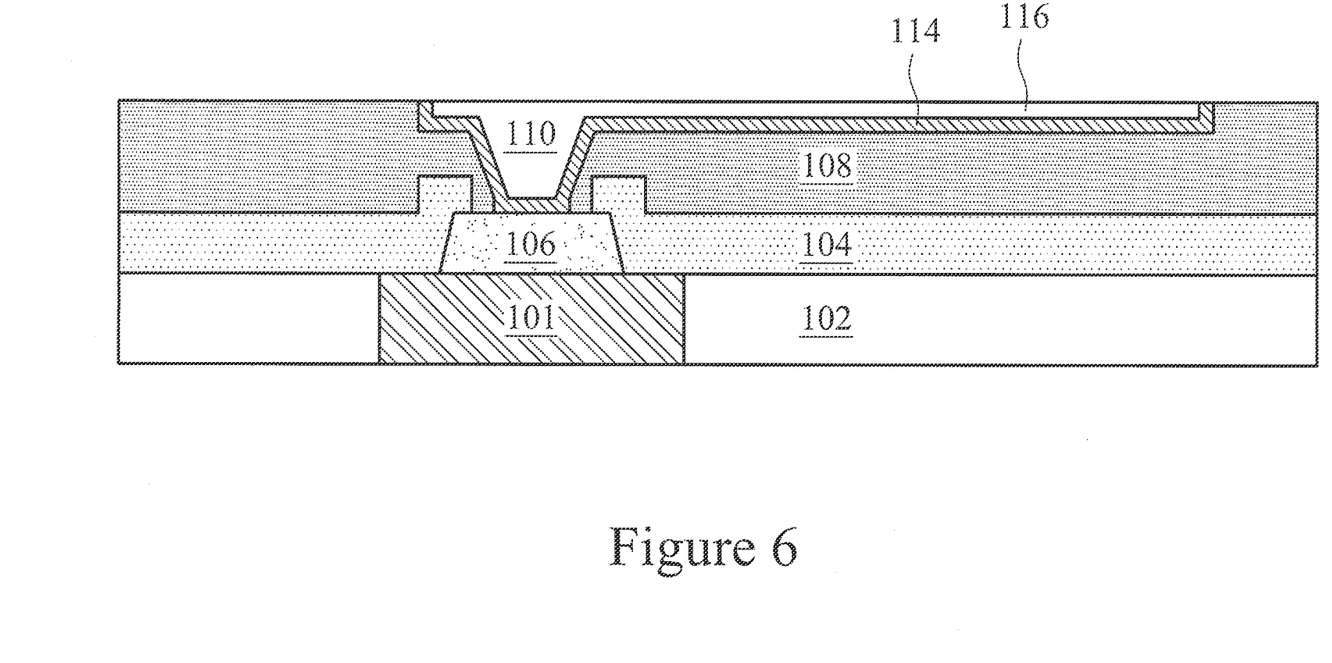
FIG. 6 illustrates a cross sectional view of the semiconductor device shown in FIG. 5 after a post passivation line is formed on top of the seed layer in accordance with an embodiment.

FIG. 6 illustrates a cross sectional view of the semiconductor device shown in FIG. 5 after a post passivation metal line is formed on top of the seed layer in accordance with an embodiment. As shown in FIG. 6, a conductive material fills the opening (e.g., opening 302 shown in FIG. 3) to form the metal line 116 of the post passivation interconnect structure 110. The conductive material may be copper, but can be any suitable conductive materials, such as copper alloys, aluminum, tungsten, silver and combinations thereof. The metal line 116 of the post passivation interconnect structure 110 may be formed by suitable techniques such as an electro-less plating process.

Figure 7:
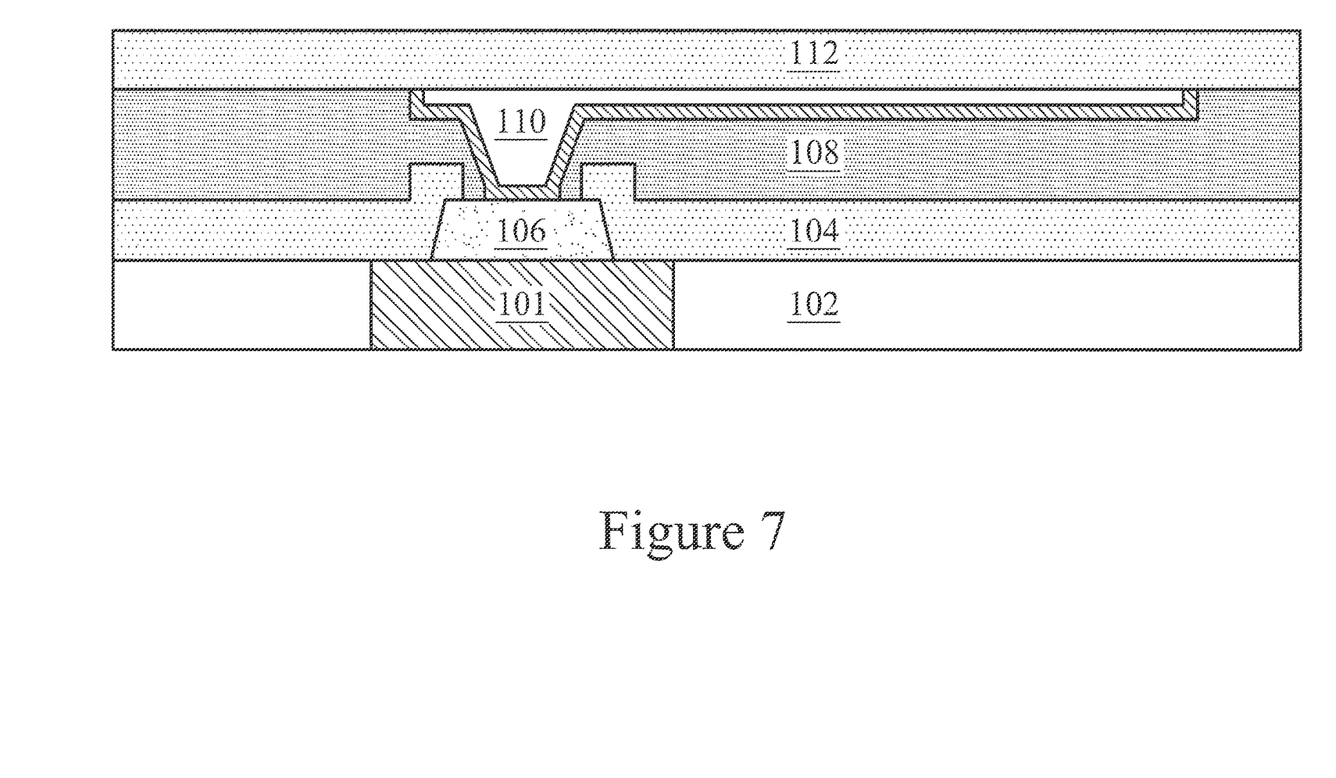
FIG. 7 illustrates a cross sectional view of the semiconductor device shown in FIG. 6 after a second polymer layer is formed over the semiconductor device in accordance with an embodiment.

FIG. 7 illustrates a cross sectional view of the semiconductor device shown in FIG. 6 after a second polymer layer is formed over the semiconductor device in accordance with an embodiment. The second polymer layer 112 is deposited on top of the first polymer layer 108. The second polymer layer 112 may be formed of suitable polymer dielectric materials such as PBO. The second polymer layer 112 may be of a thickness in a range from about 4 um to about 10 um.

Figure 8:
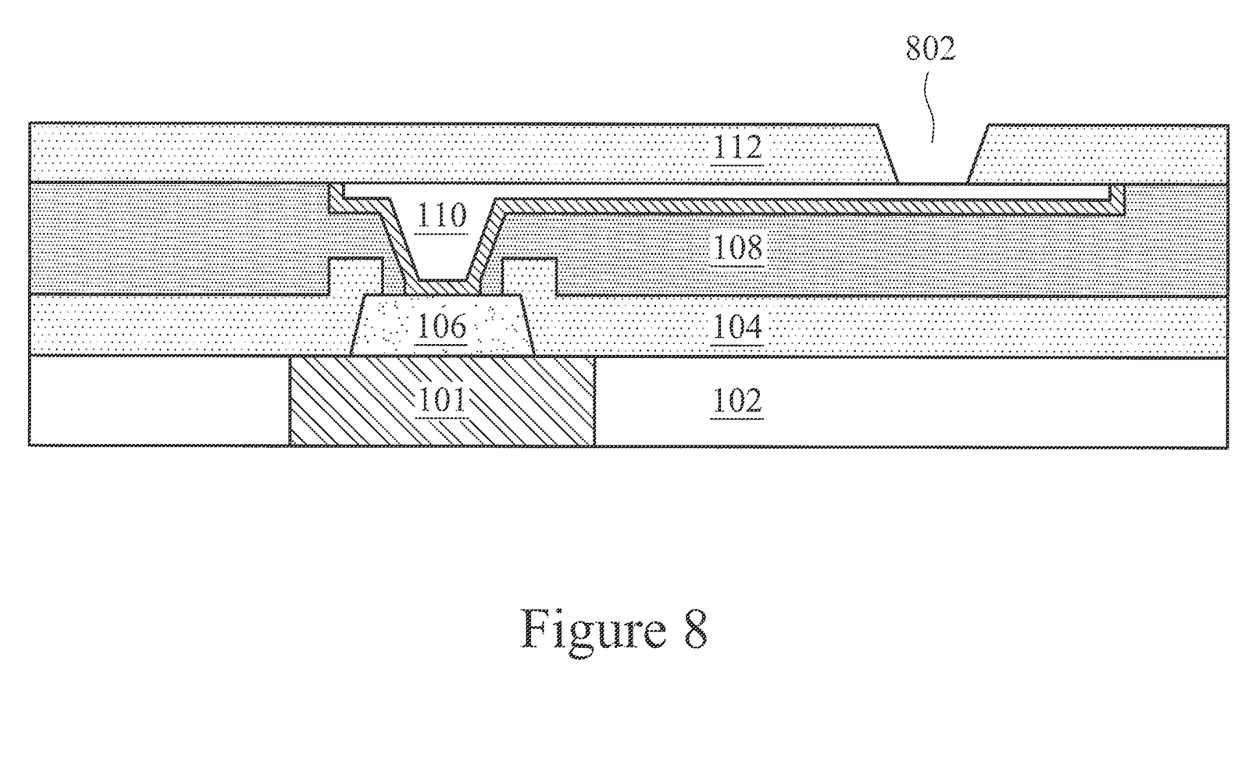
FIG. 8 illustrates a cross sectional view of the semiconductor device shown in FIG. 7 after a third patterning process is applied to the surface of the second polymer layer in accordance with an embodiment.

FIG. 8 illustrates a cross sectional view of the semiconductor device shown in FIG. 7 after a third patterning process is applied to the surface of the second polymer layer in accordance with an embodiment. The third patterning process may be implemented by using a laser ablation process. In particular, according to the shape and location of the UBM structure (not shown but illustrated in FIG. 1), a laser beam (not shown) is applied to the top surface of the second polymer layer 112 to form an opening 802. In accordance with an embodiment, the wavelength of the laser beam is about 308 nm. The energy dosage of the laser beam is in range from about 500 mJ/cm$^2$ to about 600 mJ/cm$^2$.

Figure 9:
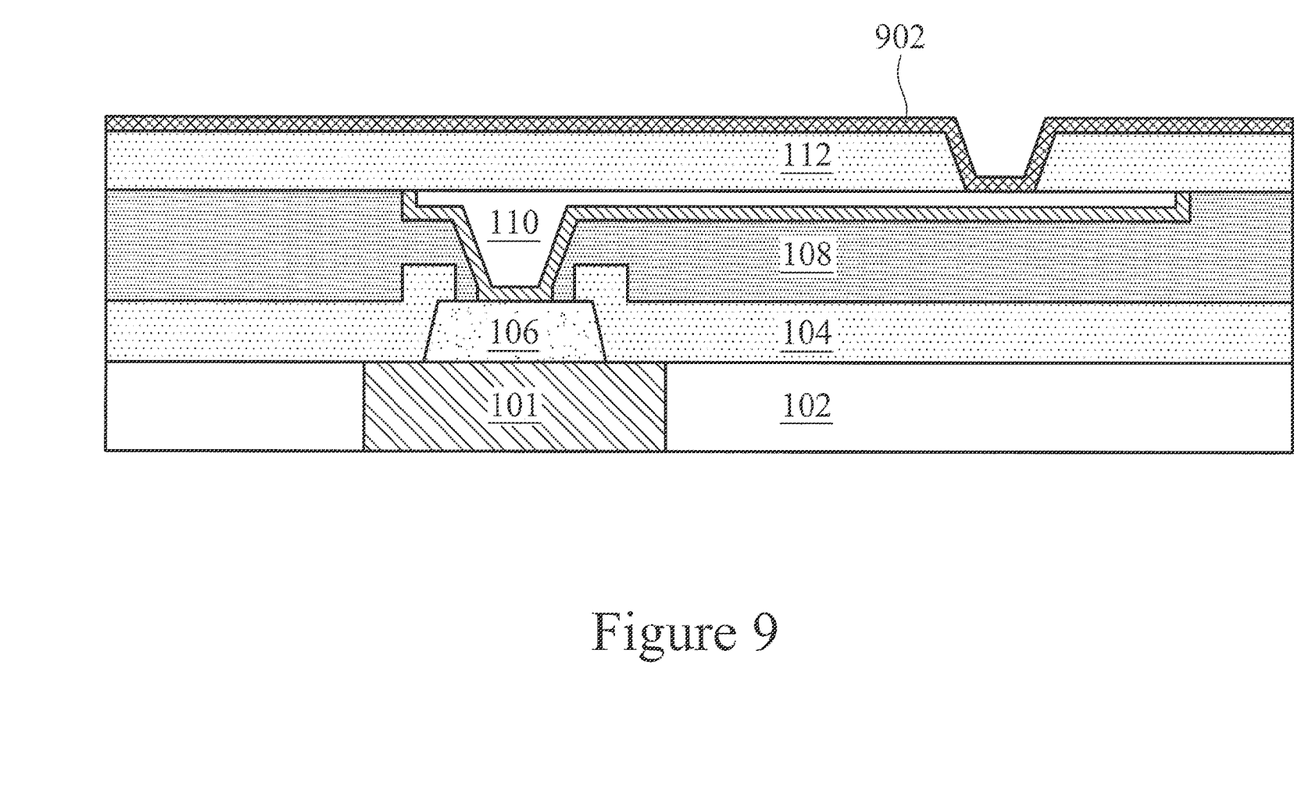
FIG. 9 illustrates a cross sectional view of the semiconductor device shown in FIG. 8 after a UBM seed layer is formed on top of the first polymer layer in accordance with an embodiment.

FIG. 9 illustrates a cross sectional view of the semiconductor device shown in FIG. 8 after a UBM seed layer is formed on top of the first polymer layer in accordance with an embodiment. The UBM seed layer 902 is deposited on the second polymer layer 112. The UBM seed layer 802 may comprise conductive materials such as copper. The UBM seed layer 802 may be implemented by using suitable fabrication techniques such as sputtering, CVD or the like.

Figure 10:
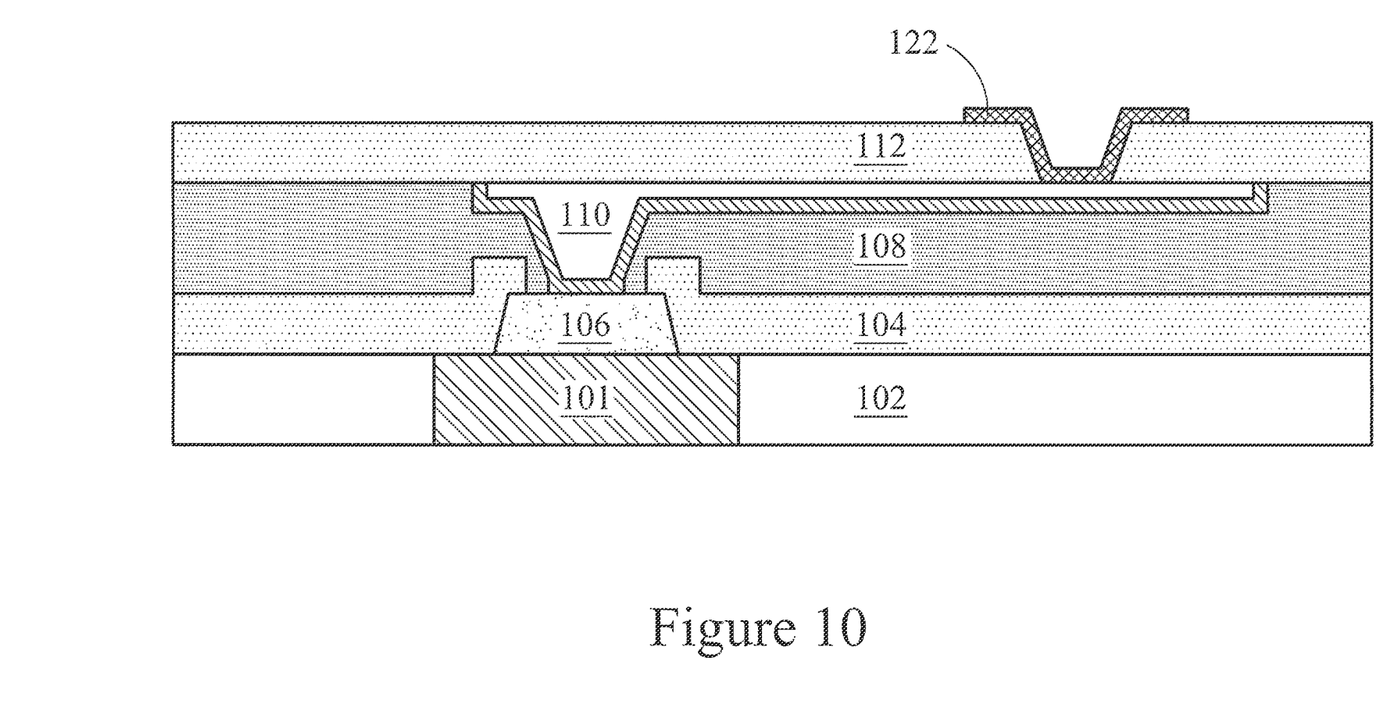
FIG. 10 illustrates a cross sectional view of the semiconductor device shown in FIG. 9 after a fourth patterning process is applied to the surface of the UBM seed layer in accordance with an embodiment.

FIG. 10 illustrates a cross sectional view of the semiconductor device shown in FIG. 9 after a fourth patterning process is applied to the surface of the UBM seed layer in accordance with an embodiment. The fourth patterning process may be implemented by using a laser ablation process. According to the location and shape of the UBM structure shown in FIG. 1, a laser beam (not shown) is applied to the top surface of the UBM seed layer 902. As a result, portions of the UBM seed layer 902 are removed. In accordance with an embodiment, the wavelength of the laser beam is about 308 nm. The energy dosage of the laser beam is in range from about 1000 mJ/cm$^2$ to about 1200 mJ/cm$^2$.

Figure 11:
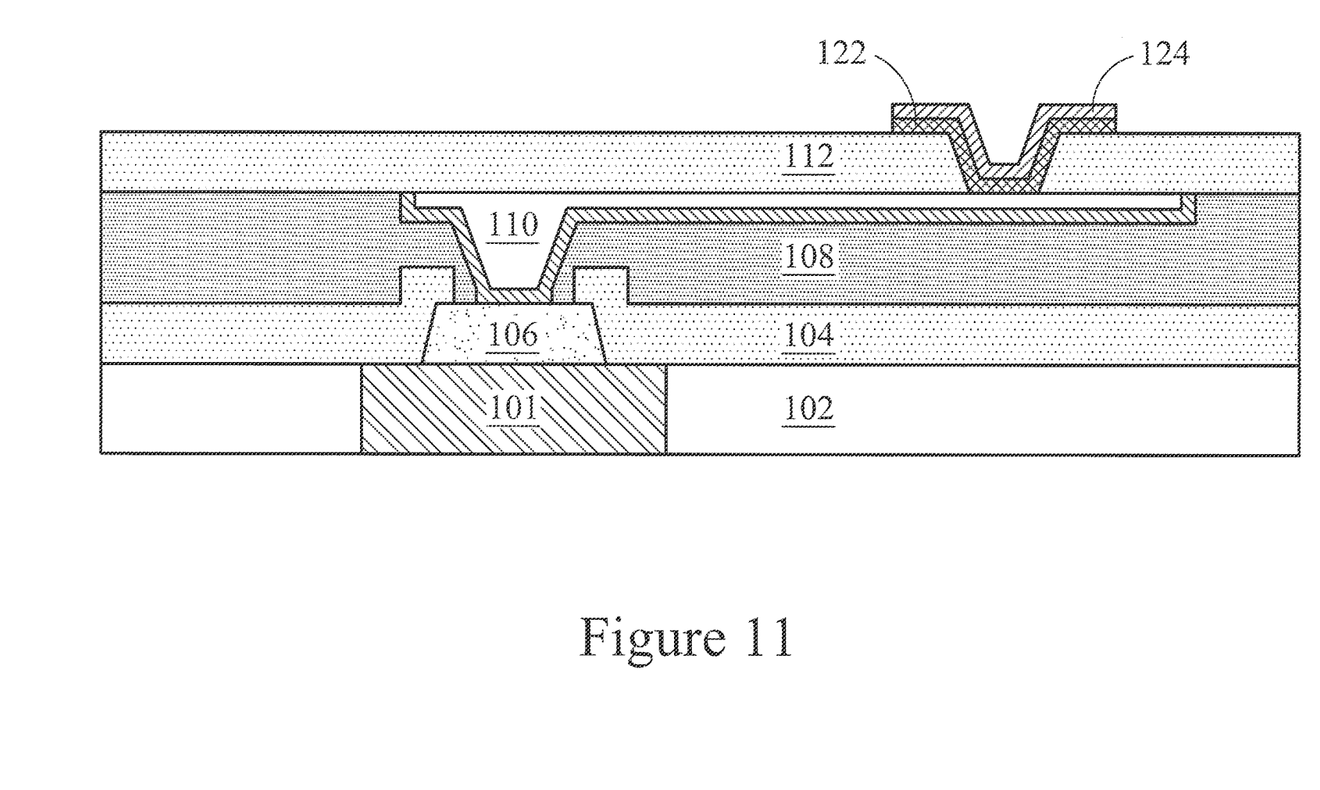
FIG. 11 illustrates a cross sectional view of the semiconductor device shown in FIG. 10 after a second conductive layer is formed on top of the UBM seed layer in accordance with an embodiment.

FIG. 11 illustrates a cross sectional view of the semiconductor device shown in FIG. 10 after a second conductive layer is formed on top of the UBM seed layer in accordance with an embodiment. As shown in FIG. 11, in order to obtain a reliable UBM structure, additional conductive materials may be deposited in a conformal manner on top of the UBM seed layer 122 to form an additional conductive layer 124. The conductive material may be copper, but can be any suitable conductive materials, such as copper alloys, aluminum, tungsten, silver and combinations thereof. The conductive layer 124 may be formed by suitable techniques such as an electro-less plating process.

Figure 12:
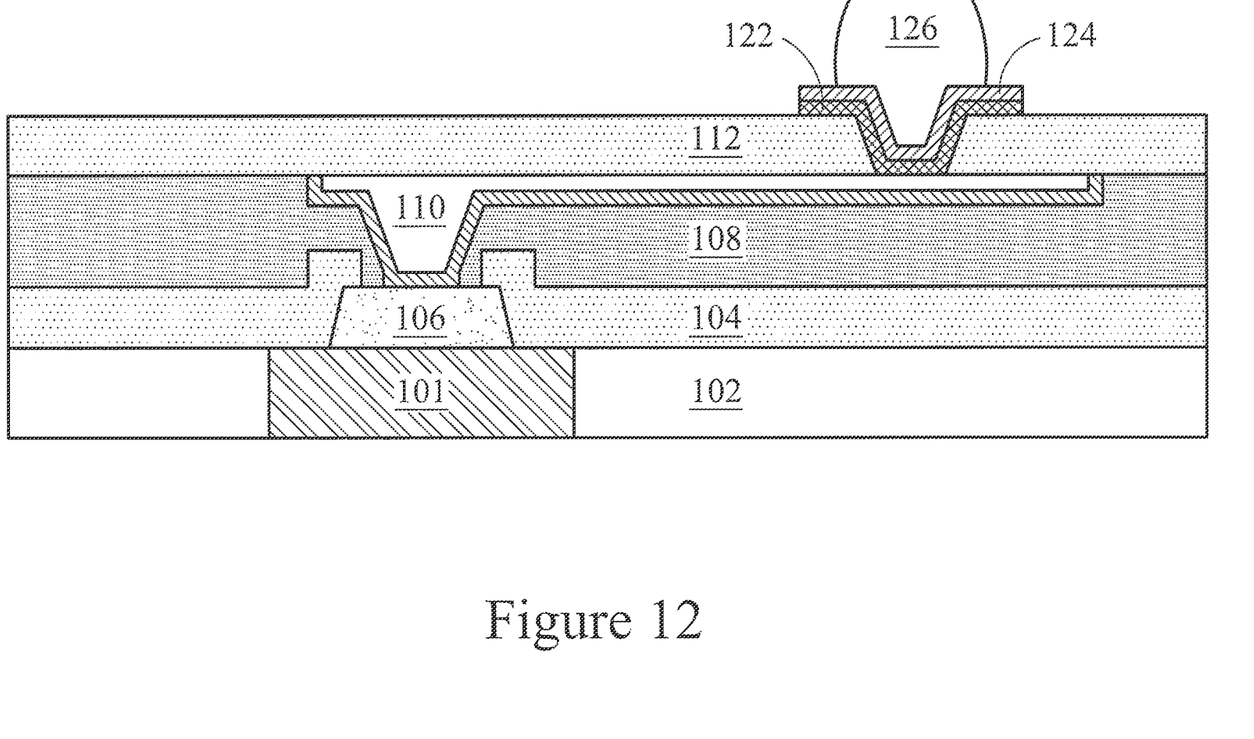
FIG. 12 illustrates a cross section view of the semiconductor device shown in FIG. 11 after an interconnect bump is formed on the UBM structure.

FIG. 12 illustrates a cross section view of the semiconductor device shown in FIG. 11 after an interconnect bump is formed on the UBM structure. The interconnect bump 126 provides an effective way to connect the semiconductor device with external circuits (not shown). In accordance with an embodiment, the interconnect bump 126 may be a solder ball. The solder ball 126 may be made of any of suitable materials. In accordance with an embodiment, the solder ball 126 may comprise SAC405. SAC405 comprises 95.5% Sn, 4.0% Ag and 0.5% Cu.

One advantageous feature of the fabrication process described above with respect to FIGS. 2-12 is that the laser ablation process helps to reduce the fabrication cost of a wafer level chip scale package. For example, in a conventional fabrication process, in order to form a post passivation interconnect structure, there may be two photo resist layers formed and removed during the fabrication process. By employing the laser ablation process described above with respect to FIGS. 2-12, the photo resist layers and their corresponding fabrication steps such as coating, exposure, development and etching are saved. As a result, the fabrication cost of the wafer level chip scale package is reduced.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a passivation layer over a substrate, wherein a metal pad is embedded in the passivation layer;
   depositing a first dielectric layer on the passivation layer;
   applying a first patterning process to the first dielectric layer to form a first opening, wherein the first patterning process is a first laser ablation process, and wherein the first laser ablation process is of a first energy level;
   forming a first seed layer over the first opening, wherein the first seed layer comprises a first sidewall portion, a second sidewall portion, a bottom portion between the first sidewall portion and the second sidewall portion, and a top portion over a top surface of the first dielectric layer;
   applying a seed layer removal process to the first seed layer, wherein the first opening between the first sidewall portion and the second sidewall portion and over the bottom portion is free of conductive materials, and wherein non-trench portions of the first seed layer are removed and the seed layer removal process is a laser process having a second energy level;
   filling the first opening with a conductive material to form a metal line, wherein a top surface of the metal line is level with a top surface of the first dielectric layer;
   depositing a second dielectric layer on the first dielectric layer;
   applying a second patterning process to the second dielectric layer to form a second opening;
   forming an under bump metallization structure over the second opening; and
   mounting an interconnect bump over the under bump metallization structure, wherein at least one of the first patterning process and the second patterning process is a laser ablation process.

2. The method of claim 1, further comprising:
   depositing an under bump metallization seed layer over the second dielectric layer; and
   removing portions of the under bump metallization seed layer through a third patterning process.

3. The method of claim 2, further comprising:
   depositing a conductive layer over the under bump metallization seed layer in a conformal manner.

4. The method of claim 3, further comprising:
   depositing the conductive layer through a first electro-less plating process.

5. The method of claim 1, further comprising:
   filling the first opening with the conductive material through a second electro-less plating process.

6. The method of claim 1, wherein the first dielectric layer is formed of a first polymer material.

7. The method of claim 1, wherein the second dielectric layer is formed of a second polymer material.

8. A method comprising:
   forming a passivation layer over a substrate, wherein a metal pad is embedded in the passivation layer and exposed through an opening of the passivation layer;
   depositing a first polymer layer on the passivation layer;
   applying a first patterning process to the first polymer layer to form a first trench, wherein the first patterning process is a first laser ablation process, and wherein the first laser ablation process is of a first energy level;
   forming a first seed layer over the first polymer layer;
   removing non-trench portions of the first seed layer through a second laser ablation process having a second energy level;
   after the step of removing non-trench portions of the first seed layer through a second laser ablation process, filling the first trench with a conductive material;
   depositing a second polymer layer on the first polymer layer;
   applying a third patterning process to the second polymer layer to form an under bump metallization opening;
   forming an under bump metallization structure in the second polymer layer; and
   mounting a solder ball over the under bump metallization structure, wherein at least one of the first patterning process and the third patterning process is a laser ablation process.

9. The method of claim 8, wherein:
   the first patterning process is a first laser ablation process of an energy level in a range from about 500 mJ/cm$^2$ to about 600 mJ/cm$^2$.

10. The method of claim 8, wherein:
    the second laser ablation process is of an energy level in a range from about 1000 mJ/cm$^2$ to about 1200 mJ/cm$^2$.

11. The method of claim 8, further comprising:
    forming the first polymer layer using PBO.

12. The method of claim 8, further comprising:
    forming the first polymer layer having a thickness in a range from about 4 um to about 10 um.

13. The method of claim 8, further comprising:
    forming the second polymer layer having a thickness in a range from about 4 um to about 10 um.

14. The method of claim 8, further comprising:
    depositing an under bump metallization seed layer over the second polymer layer;
    removing portions of the under bump metallization seed layer through a fourth patterning process; and
    depositing a conductive layer over the under bump metallization seed layer in a conformal manner to form the under bump metallization structure.

15. A method comprising:
    providing a substrate;
    forming a plurality of metal lines over the substrate;
    forming a metal pad over the metal lines;
    forming a passivation layer over the metal pad, wherein the metal pad is embedded in the passivation layer and exposed through an opening of the passivation layer;
    depositing a first dielectric layer on the passivation layer;

applying a first patterning process to the first dielectric layer to form a first trench, wherein the first patterning process is a first laser ablation process having a first energy level;

forming a first seed layer over the first dielectric layer;

removing non-trench portions of the first seed layer through a second laser ablation process having a second energy level;

after the step of removing non-trench portions of the first seed layer through the second laser ablation process, filling the first trench with a conductive material; and depositing a second dielectric layer on the first dielectric layer.

16. The method of claim 15, wherein the under bump metallization structure comprises:

applying a third patterning process to the second dielectric layer to form an under bump metallization opening; and forming an under bump metallization structure in the second dielectric layer.

17. The method of claim 16, further comprising:

mounting a solder ball over the under bump metallization structure.

18. The method of claim 15, wherein:

a top metal line of the metal lines is electrically coupled to the metal pad.

19. The method of claim 15, wherein:

the first dielectric layer is a first polymer layer comprising PBO.

20. The method of claim 15, wherein:

the first dielectric layer is a second polymer layer comprising PBO.

* * * * *